United States Patent
Sasaki et al.

(10) Patent No.: US 8,154,027 B2
(45) Date of Patent: Apr. 10, 2012

(54) SILICON CARBIDE SUBSTRATE, EPITAXIAL WAFER AND MANUFACTURING METHOD OF SILICON CARBIDE SUBSTRATE

(75) Inventors: Makoto Sasaki, Itami (JP); Shin Harada, Osaka (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 137 days.

(21) Appl. No.: 12/685,967

(22) Filed: Jan. 12, 2010

(65) Prior Publication Data

US 2010/0176403 A1 Jul. 15, 2010

(30) Foreign Application Priority Data

Jan. 13, 2009 (JP) .................... 2009-004839

(51) Int. Cl.
*H01L 29/24* (2006.01)
(52) U.S. Cl. .................. 257/77; 257/E29.104
(58) Field of Classification Search .......... 257/77, 257/E29.104
See application file for complete search history.

(56) References Cited

U.S. PATENT DOCUMENTS

| | | | |
|---|---|---|---|
| 2002/0166572 A1 | 11/2002 | Chen | |
| 2006/0267128 A1* | 11/2006 | Kawami | 257/471 |
| 2011/0121317 A1* | 5/2011 | Shibagaki et al. | 257/77 |

FOREIGN PATENT DOCUMENTS

| | | |
|---|---|---|
| JP | 2000-26199 | 1/2000 |
| JP | 2003-332562 | 11/2003 |
| JP | 2007-269627 | 10/2007 |
| JP | 2008-280207 A | 11/2008 |
| JP | 2008-290888 A | 12/2008 |

* cited by examiner

*Primary Examiner* — Cuong Q Nguyen
*Assistant Examiner* — Tran Tran
(74) *Attorney, Agent, or Firm* — Drinker Biddle & Reath LLP

(57) ABSTRACT

An SiC substrate includes the steps of preparing a base substrate having a main surface and made of SiC, washing the main surface using a first alkaline solution, and washing the main surface using a second alkaline solution after the step of washing with the first alkaline solution. The SiC substrate has the main surface, and an average of residues on the main surface are equal to or larger than 0.2 and smaller than 200 in number.

11 Claims, 9 Drawing Sheets

FIG.1
(A)
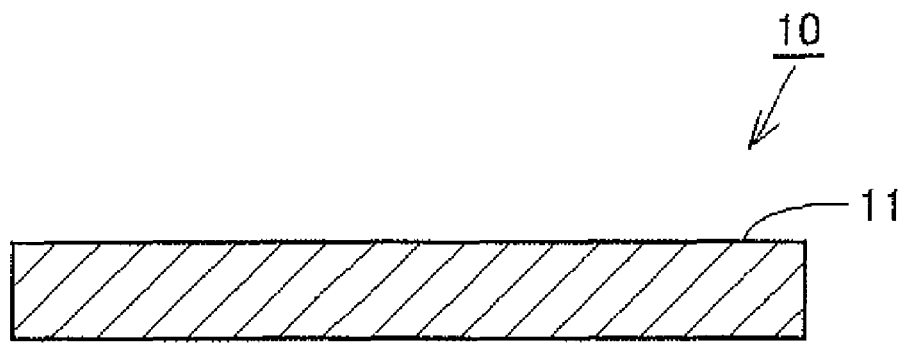
(B)
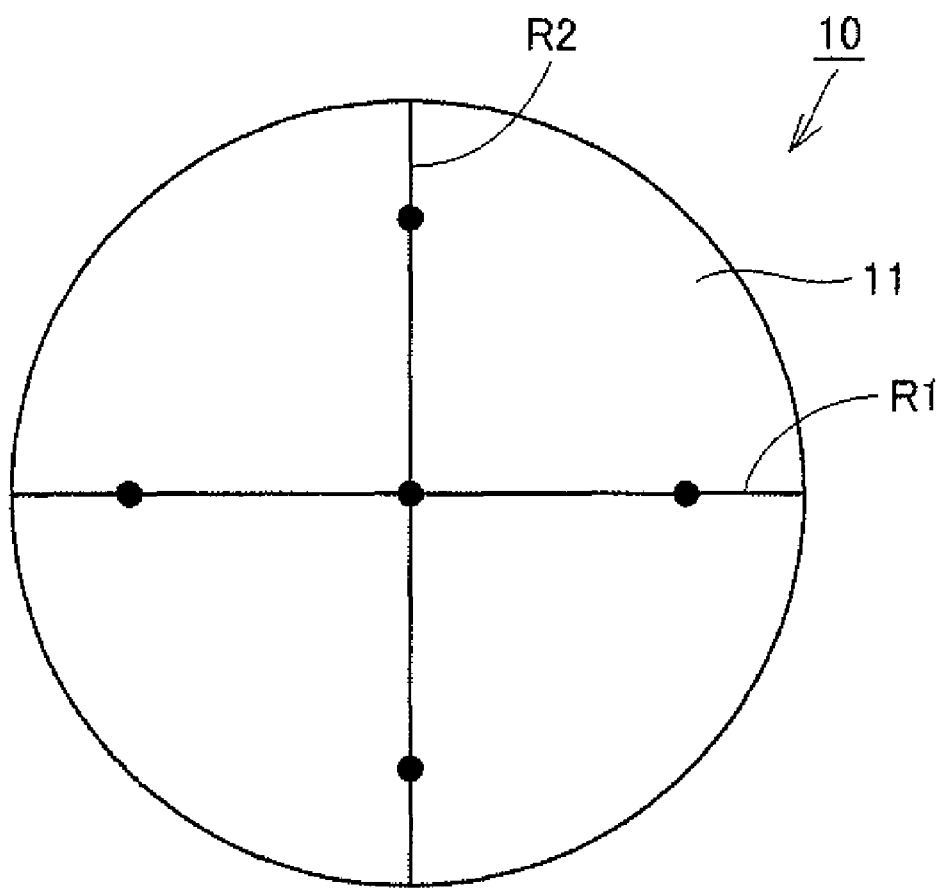

SILICON CARBIDE SUBSTRATE, EPITAXIAL WAFER AND MANUFACTURING METHOD OF SILICON CARBIDE SUBSTRATE

BACKGROUND OF THE INVENTION

1. Field of the Invention

The present invention relates to a silicon carbide substrate, an epitaxial wafer and a manufacturing method of a silicon carbide substrate.

2. Description of the Background Art

Silicon carbide (SiC) has a large band gap, and a maximum insulation breakdown electric field and thermal conductivity thereof are larger than those of silicon (Si). However, a mobility of carriers of the silicon carbide is substantially similar to that of the silicon, and a saturation drift velocity of electrons and a breakdown voltage of the silicon carbide are large. Therefore, it has been expected to apply it to semiconductor devices that are required to have higher efficiency, high breakdown voltage and large capacity.

Many defects such as micropipes are present in an SiC substrate used in the SiC semiconductor device. Therefore, researches have been made on conditions and the like of epitaxial growth for removing the effects existing in the SiC substrate by the epitaxial growth (e.g., Japanese Patent Laying-Open No. 2000-26199 (Patent Document 1), Japanese Patent Laying-Open No. 2003-332562 (Patent Document 2) and Japanese Patent Laying-Open No. 2007-269627 (Patent Document 3)).

In general, the SiC substrates are manufactured by forming an SiC ingot, cutting the SiC ingot into the SiC substrates and polishing them. According to the above patent documents 1 to 3, however, an abrasive liquid used for manufacturing the SIC substrate, a fixing agent for fixing the SiC substrate during the polishing and the like are left as adhered residues. The inventors have found that defects due to these residues are formed in an epitaxial layer when the epitaxial layer is formed on the SiC substrate carrying the residues adhered thereto. When the epitaxial layer containing such defects is used in the semiconductor device, operations of the semiconductor device are adversely affected.

SUMMARY OF THE INVENTION

The invention has been made for overcoming the above problem, and an object of the invention is to provide an SiC substrate, an epitaxial wafer and a manufacturing method of the SiC substrate that can be used for manufacturing a semiconductor device and thereby can suppress an influence that may be exerted on operations of the semiconductor device.

The inventors have earnestly studied relationships between residues adhering to a main surface of an SiC substrate having a polished surface and defects due to the residues that occurred when an epitaxial layer was formed. As a result, the inventors have found a range that can effectively reduce the defects caused by the residues occurring in a process of forming the epitaxial layer.

An SiC substrate according to one aspect of the invention includes a main surface, and residues on the main surface. The main surface is washed using a first alkaline solution; and the main surface is washed using a second alkaline solution after washing the main surface using the first alkaline solution. An average of the residues on the main surface washed using the second alkaline solution are equal to or larger than 0.2 and smaller than 200 in number.

An SiC substrate according to another aspect of the invention includes a main surface, and residues on the main surface. The main surface is washed using a first alkaline solution; the main surface is washed using a second alkaline solution after washing the main surface using the first alkaline solution; and the main surface is etched after washing the main surface using the second alkaline solution. An average of the residues on the main surface being etched are between 0.2 and 5 in number.

In the SiC substrate according to one aspect of the invention, an average of the residues on the main surface are equal to or larger than 0.2 and smaller than 200 in number before the step of the etching. In the SiC substrate according to another aspect of the invention, an average of the residues on the main surface are equal to or larger than 0.2 and smaller than 5 in number after the step of etching. This can suppress formation of defects due to the residues in an epitaxial layer that is formed on the main surface of the SiC substrate. This can suppress an influence that may be exerted by defects on an operation of a manufactured semiconductor device including this SiC substrate.

The above "residues" means residues that occurred in a process of producing the SiC substrate from an ingot.

Preferably, in the SIC substrate of the above one aspect, the average of the residues on the main surface is between 0.2 and 50.

Preferably, in the SiC substrate of the other aspect, the average of the residues on the main surface is between 0.2 and 0.4.

By reducing the residues as described above, it is possible to suppress effectively such a situation that defects due to the residues are formed in an epitaxial layer. Therefore, it is possible to suppress an influence on an operation of the semiconductor device manufactured using the SiC substrates.

Preferably, in the SiC substrate of the above one and other aspects, the residue is made of at least one type of substance selected from a group consisting of colloidal silica, chrome oxide, diamond, adhesive and wax.

Thereby, an abrasive agent and a fixing agent for the above substrate can be used in a step of polishing performed for preparing the base substrate.

Preferably, in the SiC substrate of the above one and other aspects, the adhesive or wax is made of at least one type of substance selected from a group consisting of hot melt, acrylic and epoxy.

Thereby, a fixing agent and the like of the above substance can be used for manufacturing the SiC substrate.

Preferably, in the SiC substrate of the above one and other aspects, the residue has a diameter between 0.01 nm and 10 μm.

The residues larger than 10 μm in diameter is likely to fall under its own weight, and therefore is less likely to adhere to the main surface of the SiC substrate. Thus, the residues of 10 μm or less are easily measured. The residues smaller than 0.01 μm are less likely to become residues causing defects. Thus, the residues of 0.01 nm or more generate the defects by themselves in the epitaxial layer. By specifying the residues of the above diameters, the defects generated in the epitaxial layer can be suppressed to a higher extent.

An epitaxial wafer of the invention includes the SiC substrate described above; and an epitaxial layer formed on the main surface of the SiC substrate.

Since the epitaxial wafer of the invention used the above substrate carrying a reduced average of residues, it can form the epitaxial layer in which defects due to the residues are reduced. Therefore, it is possible suppress an influence on an operation of a semiconductor device manufactured using this epitaxial wafer.

A manufacturing method of an SiC substrate of the invention includes the following steps. A base substrate having a main surface and made of silicon carbide is prepared. The main surface is washed using a first alkaline solution. The main surface is washed using a second alkaline solution after the step of washing using the first alkaline solution.

According to the manufacturing method of the SiC substrate of the invention, the washing using the alkaline solution is performed more than once. Since the washing using the first alkaline solution removes the residues on the main surface, conspicuous residues can be removed. In this state, the washing using the second alkaline solution is performed so that fine residues and firmly adhered residues can be removed. Therefore, the average of residues can be reduced to a range equal to or larger than 0.2 and smaller than 200 as described above.

Preferably, the above manufacturing method of the SiC substrate further includes a step of washing the main surface using a third alkaline solution containing potassium hydroxide prior to the step of washing using the first alkaline solution.

The alkaline solution containing potassium hydroxide can reduce the residues very effectively, and therefore can reduce the residues more effectively.

Preferably, the above manufacturing method of the SiC substrate further includes a step of washing the main surface using an acid solution. This can reduce heavy metal and the like adhered thereto.

Preferably, the above manufacturing method of the SiC substrate further includes a step of etching the main surface after the step of washing using the second alkaline solution.

This can reduce the average of residues adhered to the main surface, e.g., to a range between 0.2 and 5.

Preferably, in the above manufacturing method of the SiC substrate, the etching step uses a gas containing at least one of a hydrogen gas and a hydrogen chloride gas. This can further reduce the average of residues adhered to the main surface.

According to the SiC substrate and the manufacturing method of the SiC substrate of the invention, as described above, the average of residues on the main surface is reduced to a range equal to or larger than 0.2 and smaller than 200 so that it is possible suppress an influence on an operation of the semiconductor device manufactured using the SiC substrate.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 schematically shows an SiC substrate in a first embodiment of the invention, and (A) and (B) are a cross section and a plan, respectively.

DESCRIPTION OF THE PREFERRED EMBODIMENTS

Figure 2:
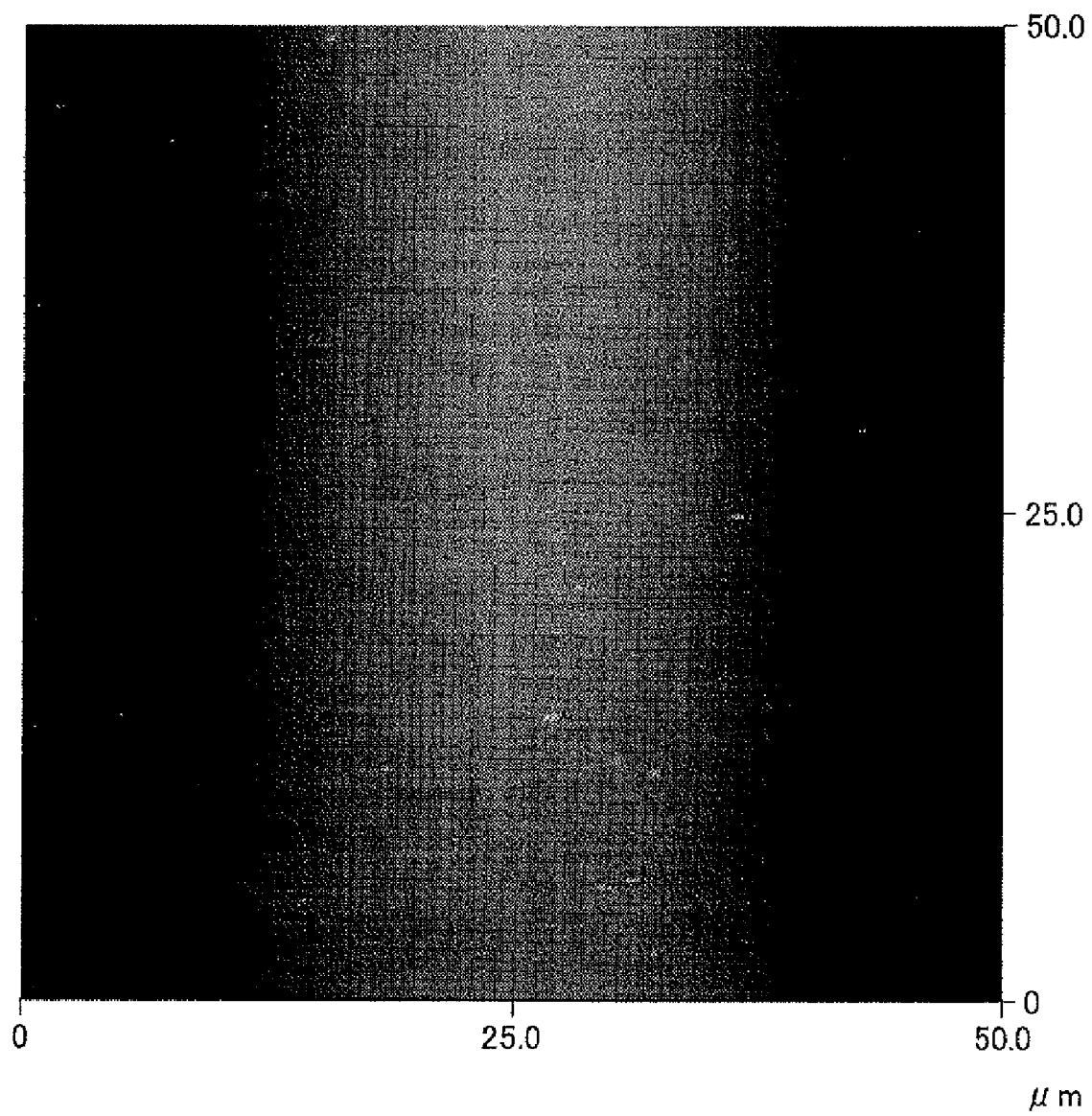
FIG. 2 shows residues observed through an AFM on a main surface of the SiC substrate in the first embodiment of the invention.

Embodiments of the invention will now be described with reference to the drawings. In the following description, the same or corresponding portions bear the same reference numbers, and description thereof is not repeated. In the specification, "< >" represents a set orientation, and "( )" represents an individual plane. In crystallography, a negative index is represented by giving an overbar to a number. In the specification, however, it is represented by giving a preceding negative sign to a number.

First Embodiment

Referring to FIG. 1, an SiC substrate 10 of an embodiment of the invention will be described below. SiC substrate 10 has a main surface 11.

An average of residues on main surface 11 of SiC substrate 10 are equal to or larger than 0.2 and smaller than 200 in number, preferably between 0.2 and 50, more preferably between 0.2 and 5 and further preferably between 0.2 and 0.4.

When the average of residues are fewer than 200 and an epitaxial layer is formed on main surface 11, it is possible to suppress such a situation that defects due to the residues are formed in the epitaxial layer. This can suppress an influence on an operation of a semiconductor device manufactured using this SiC substrate. When the residues are 50 or less, it is possible to suppress further the formation of defects in the epitaxial layer due to the residues. When the residues are 5 or less, it is possible to suppress further more the formation of defects in the epitaxial layer due to the residues. When the residues are 0.4 in number, it is possible to suppress most effectively the formation of defects in the epitaxial layer due to the residues.

The "residues" will now be described below. The residue means a substance that occurs when SiC substrate 10 is produced from an SiC ingot. These residues are observed as white or yellow spots when measured with an AFM (Atomic Force Microscope), as shown in FIG. 2. Small residues are observed as yellow spots, and large residues are observed as white spots.

The residues are measured by obtaining an average of values determined from five-point measurement with the AFM within a visual field with sides of 50 µm. When a visual field with sides other than 50 µm is used, the obtained values are converted into those corresponding to the sides of 50 µm. For example, when the number of residues is zero at four points within the visual field with sides of 50 µm, and the number of residue is one within it, the average is 0.2. Fewer residues are more preferably. However, there is possibility that the residues are present somewhere on main surface 11 so that the lower limit value of the average of residues is, e.g., 0.2.

The five points for measurement are arbitrarily selected. However, it is preferable that the measurement is performed at five points on main surface 11 indicated, e.g., by dots in FIG. 1(B), and specifically at five points including one point near a center on arbitrary diameters R1 and R2, two points on the opposite sides of the above center, and two points that are present on diameter R2 perpendicular to diameter R1 and are located on the opposite sides of the above center.

Preferably, the residues are made of at least one type of substance selected from a group consisting colloidal silica, chrome oxide, diamond, adhesive and wax. For example, the adhesive or wax is made of at least one type of substance selected from a group consisting hot melt, acrylic and epoxy adhesives. Thereby, the abrasive and fixing agents already described can be used for manufacturing SiC substrate 10.

The residues have a diameter, e.g., between 0.01 nm and 10 μm. The residue larger than 10 μm in diameter is likely to fall under its own weight, and therefore is less likely to adhere to main surface 11 of SiC substrate 10. Thus, the residues of 10 μm or less are easily measured. The residues smaller than 0.01 nm are less likely to become residues causing defects. Thus, the residues of 0.01 nm or more generate the defects by themselves in the epitaxial layer. By specifying the residues of the above diameters, the defects generated in the epitaxial layer can be suppressed to a higher extent.

When the residue is a sphere, the above diameter of the residue is a diameter of the sphere. When the residue is not a sphere, the diameter thereof is a diameter of a circumpacific sphere thereof.

Figure 3:
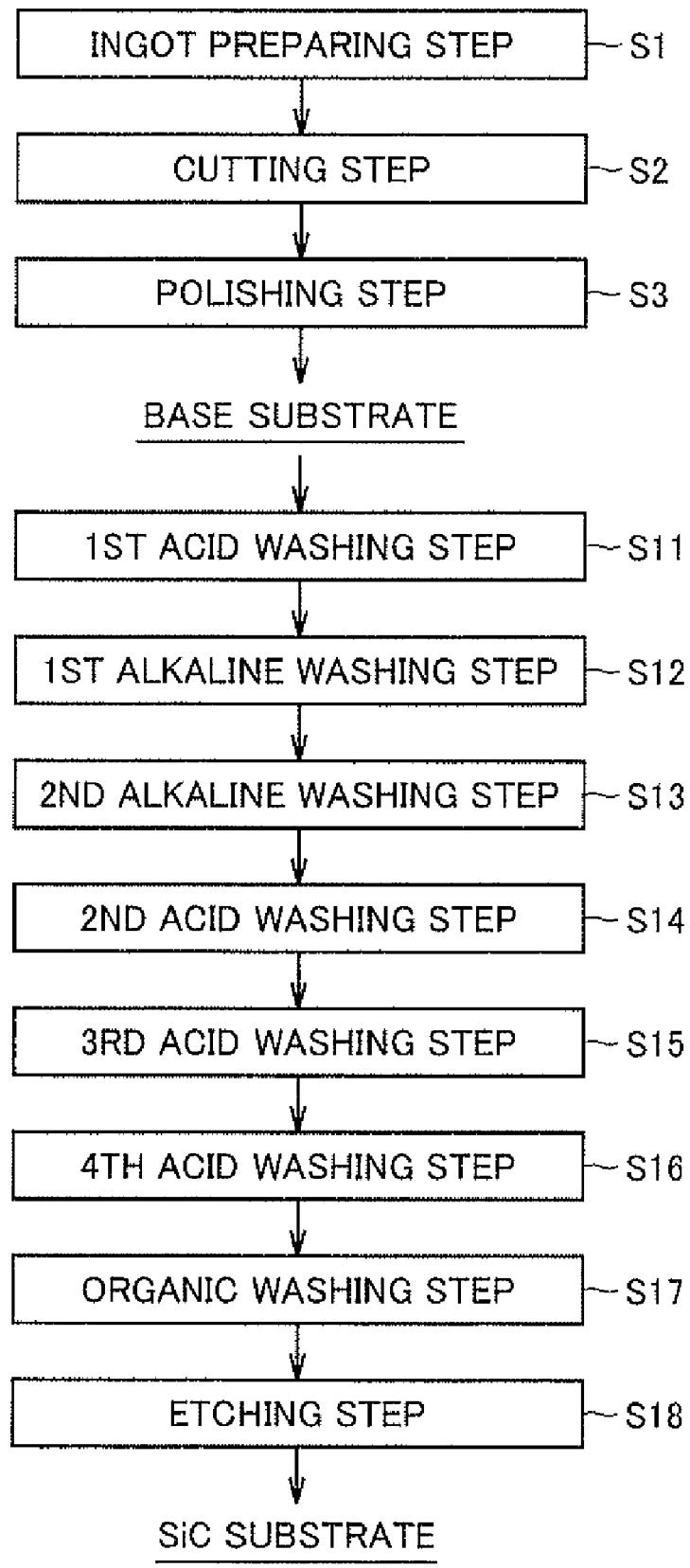
FIGS. 3 to 5 are flowcharts showing methods of manufacturing the SiC substrate in first to third embodiments of the invention, respectively.

Referring to FIGS. 1 and 3, description will be given on a method of manufacturing SiC substrate 10 in the embodiment.

First, an SiC ingot is prepared (step S1: ingot preparing step). The SiC ingot is prepared, e.g., by growing the SiC ingot by a vapor growth method such as an HVPE (Hydride Vapor Phase Epitaxy) method, MBE (Molecular Beam Epitaxy) method, OMVPE (Organo Metallic Vapor Phase Epitaxy) method, sublimation method or CVD (Chemical Vapor Deposition) method, or a liquid phase growth method such as a flux method or a high-nitrogen-pressure liquid solution method.

Then, the SiC substrate as base substrate having a main surface is cut from the SiC ingot (step S2: cutting step). The manner of cutting is not particularly restricted, and the SiC substrate is cut from the SiC ingot by slicing.

Then, the main surface of the SiC substrate thus cut is polished (step S3: polishing step). Only the main surface may be polished, or a rear surface opposite to the main surface may be additionally polished.

In the polishing step (S3), for example, CMP (Chemical Mechanical Polishing) is performed for flattening the main surface and reducing damage to it. It is preferable in the CMP to use colloidal silica as an abrasive agent, to use diamond or chrome oxide as abrasive grain and to use an adhesive or wax as a fixing agent. As the adhesive or wax, it is preferable to use at least one type of substance selected from a group consisting of hot melt, acrylic and epoxy.

In the polishing step (S3), another type of polishing such as electrolytic polishing, chemical polishing or mechanical polishing may be performed together with or instead of the CMP.

Through the above steps S1-S3, it is possible to prepare the base substrate that has the main surface and is made of the SiC.

Then, the main surface of the base substrate is washed using a first acid solution (step S11: first acid washing step). This can remove impurities such as heavy metal adhered to the main surface.

The first acid solution may be a mixture, e.g., of sulfuric acid and hydrogen peroxide water. A mixing ratio is not particularly restricted, and the sulfuric acid and hydrogen peroxide are mixed at the ratio, e.g., of 5:1. The temperature of the first acid solution is not particularly restricted and is, e.g., 80° C. The first acid washing step (S11) may be omitted.

Then, the main surface of the base substrate is washed with pure water. This can reduce the adhered first acid solution. This step may be omitted.

Then, the main surface of the base substrate is washed using the first alkaline solution (step S12: first alkaline washing step). This can remove conspicuous residues.

The first alkaline solution may be a solution of a mixture of ammonia water and hydrogen peroxide water. A mixing ratio is not particularly restricted, and the water, ammonia and hydrogen peroxide water are mixed at the ratio, e.g., of 5:1:5. The temperature of the first alkaline solution is not particularly restricted and is, e.g., 80° C. The washing time is in a range, e.g., between 1 minute and 2 hours. In the first alkaline washing step (S12), the base substrate is immersed, e.g., in the first alkaline solution.

Then, the main surface of the base substrate is washed using pure water. This can reduce the adhesion of the first alkaline solution. This step may be omitted.

After the step (first alkaline washing step (S12)) of washing using the first alkaline solution, the main surface is washed using a second alkaline solution (step S13: second alkaline washing step). This can remove fine residues and firmly adhered residues.

The second alkaline solution is substantially the same as the first alkaline solution. The second alkaline solution may be different from the first alkaline solution. The washing time is, e.g., in a range between 1 minute and 2 hours. In the second alkaline washing step (S13), the base substrate is immersed, e.g., in the second alkaline solution.

Preferably, the second alkaline solution does not contain potassium hydroxide. This can suppress such a situation that potassium ions in the potassium hydroxide remain on washed SiC substrate 10. Therefore, when the semiconductor device is manufactured using SiC substrate 10, the influence on the operation of the semiconductor device can be reduced.

Then, the main surface of the base substrate is washed with pure water. This can reduce the adhesion of the second alkaline solution. This step may be omitted.

Then, the main surface is washed using a second acid solution (step S14: second acid washing step). This can further remove the impurities such as heavy metal.

The second acid solution may be a mixture of water, hydrochloric acid and hydrogen peroxide water. A mixing ratio is not particularly restricted, and the water, hydrochloric acid and hydrogen peroxide water are mixed at the ratio, e.g., of 6:1:1. The temperature of the second acid solution is not particularly restricted and is, e.g., 80° C. The second acid solution may the same as the first acid solution and also may be different from it. The second acid washing step (S14) may be omitted.

Then, the main surface of the base substrate is washed using pure water. This can reduce the adhesion of the second alkaline solution. This step may be omitted.

Then, the main surface is washed using a third acid solution (step S15: third acid washing step). For example, the third acid solution may be a nitrohydrochloric acid that is a mixture of nitric acid and a hydrochloric acid. A mixing ratio is not particularly restricted, and the nitric acid and hydrochloric acid are mixed at the ratio, e.g., of 3:1. This can etch the main surface so that the impurities are further reduced. This third acid washing step (S15) may be omitted.

Then, the main surface of the base substrate is washed using pure water. This can reduce adhesion of the third acid solution. This step may be omitted.

Then, the main surface is washed using a fourth acid solution (step S16: fourth acid washing step). For example, the fourth acid solution may be a fluorine-containing solution. This can further reduce the impurities. The fourth acid washing step (S16) may be omitted.

Then, the main surface is washed using an organic solvent (step S17: organic washing step). For example, the organic solvent may be isopropyl alcohol. This can reduce lipophilic impurities. This organic washing step (S17) may be omitted.

Then, the main surface of the base substrate is washed using pure water. This can reduce adhesion of the organic solvent. This step may be omitted.

Through the above steps (S11-S17), SiC substrate 10 shown in FIG. 1 can be manufactured. The average of residues on main surface 11 of SiC substrate 10 are equal to or more than 0.2 and smaller than 200 in number, and preferably are between 0.2 and 50. When the average of residues on main surface 11 are to be reduced further, the following steps are executed.

After the step (S13) of washing using the second alkaline solution, main surface 11 is etched (step S18: etching step). This etching step (S18) is preferably performed with a gas containing at least one of a hydrogen gas and a hydrogen chloride gas, and more preferably is performed with a gas containing both of them. This etching step (S18) can be executed within a CVD (Chemical Vapor Deposition) device. This can reduce an average of the residues on main surface 11 of SiC substrate 10 to a range between 0.2 and 5 in number, and preferably to a range between 0.2 and 0.4 in number.

Therefore, SiC substrate 10 in this embodiment can be appropriately used in functional devices using various magneto-resistive effects such as a tunnel magneto-resistive element and a giant magneto-resistive element, light emitting devices such as a light emitting diode and a laser diode, electron devices such as a rectifier, bipolar transistor, Field Effect Transistor (FET) and HEMT (High Electron Mobility Transistor), semiconductor sensors such as a temperature sensor, pressure sensor, radiation sensor and visible-ultraviolet photosensor, SAW devices and others.

Second Embodiment

An SiC substrate according to this embodiment is substantially the same as SiC substrate 10 of the first embodiment shown in FIG. 1.

A manufacturing method of the SiC substrate according to the embodiment has basically the same steps as the method of manufacturing SiC substrate 10 according to the first embodiment, but is different therefrom in that the method further includes a fifth acid washing step (S19) between the first and second alkaline washing steps (S12 and S13).

The fifth acid washing step (S19) washes the main surface of the base substrate with a fifth acid solution. The fifth acid solution is substantially the same as the second acid solution used in the second acid washing step (S13). The fifth acid solution may be different from the second acid solution.

Third Embodiment

The SiC substrate according to this embodiment is substantially the same as SiC substrate 10 of the first embodiment shown in FIG. 1.

Figure 5:
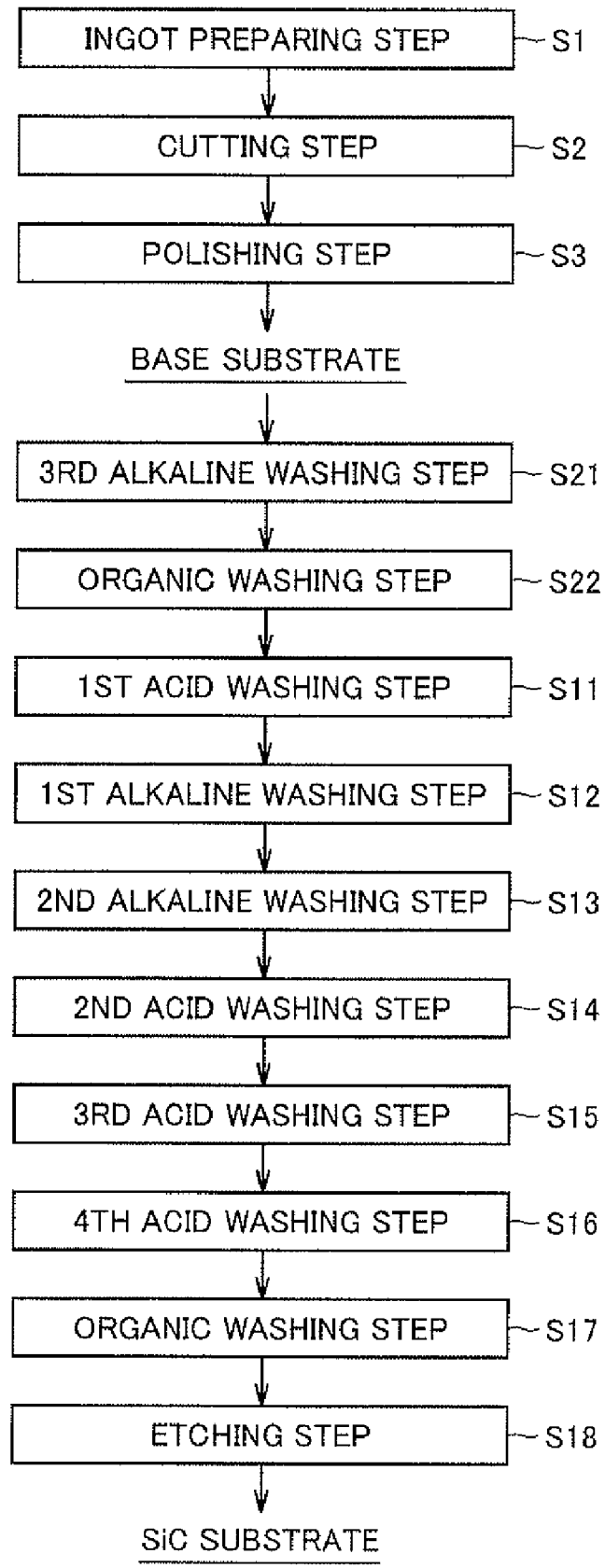

A manufacturing method of the SiC substrate according to this embodiment includes substantially the same steps as the method of manufacturing SiC substrate 10 according to the first embodiment, but is different therefrom in that the method further includes a third alkaline washing step (S21) and an organic washing step (S22) as shown in FIG. 5. The third alkaline washing step (S21) performs the washing using a third alkaline solution containing, e.g., potassium hydroxide prior to the first alkaline washing step (S12) that performs the washing using the first alkaline solution. The third alkaline solution has a pH preferably exceeding 10 and more preferably exceeding 13.

In the third alkaline washing step (S21), the base substrate is immersed, e.g., in the third alkaline solution. The washing time is between 1 minute and two hours.

The organic washing step (S22) washes the main surface with an organic solution after third alkaline washing step (S21). This can reduce the third alkaline solution containing potassium hydroxide.

Preferably, the method further includes a step of performing the washing using pure water after the organic washing step (S22).

Fourth Embodiment

Figure 6:
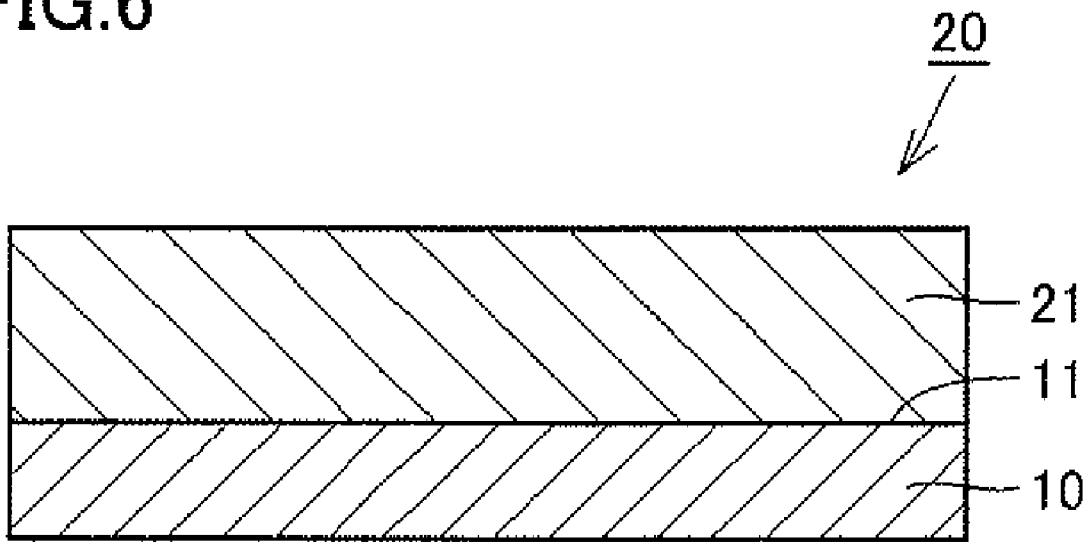
FIG. 6 is a cross section schematically showing an epitaxial wafer in a fourth embodiment of the invention.

Referring to FIG. 6, an epitaxial wafer 20 according to this embodiment will be described below. Epitaxial wafer 20 according to this embodiment includes an SiC substrate 10 of the first, second or third embodiment as well as an epitaxial layer 21 formed on main surface 11 of SiC substrate 10.

Epitaxial layer 21 is, e.g., an SiC layer. Epitaxial layer 21 may be formed of one layer or multiple layers.

Figure 7:
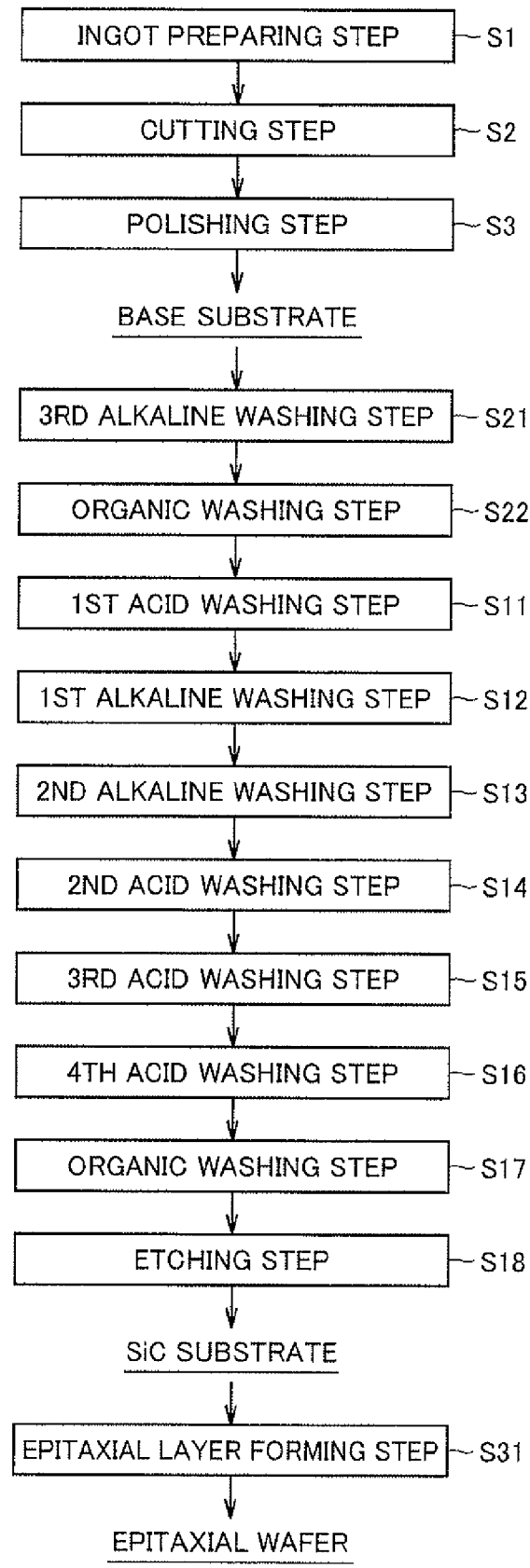
FIG. 7 is a flowchart illustrating a manufacturing method of the epitaxial wafer in the fourth embodiment of the invention.
Figure 8:
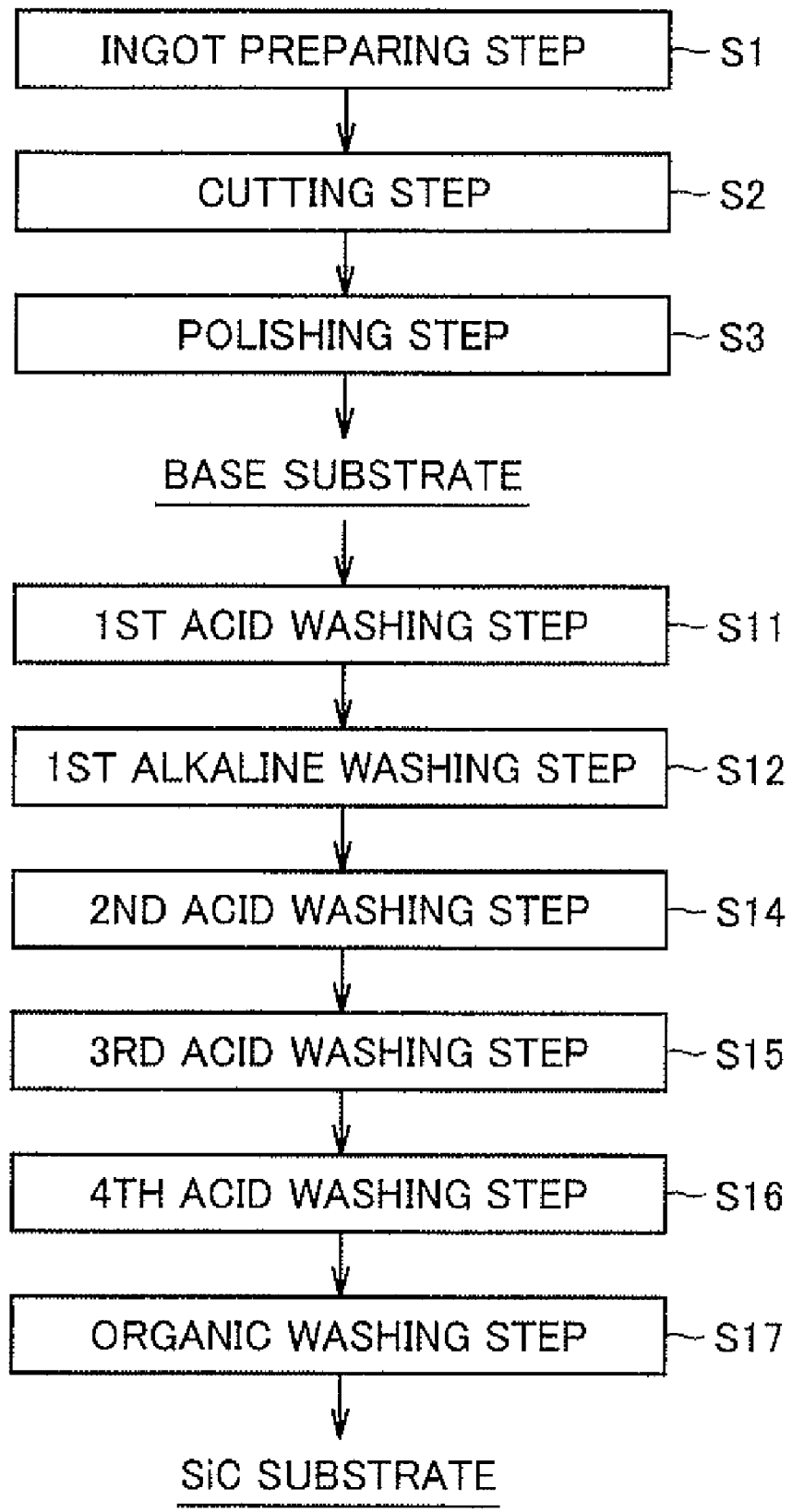
FIG. 8 is a flowchart showing a manufacturing method of an SiC substrate in a comparison example 1.

Referring to FIGS. 6 and 7, description will be given on a method of manufacturing epitaxial wafer 20 according to the embodiment.

Figure 4:
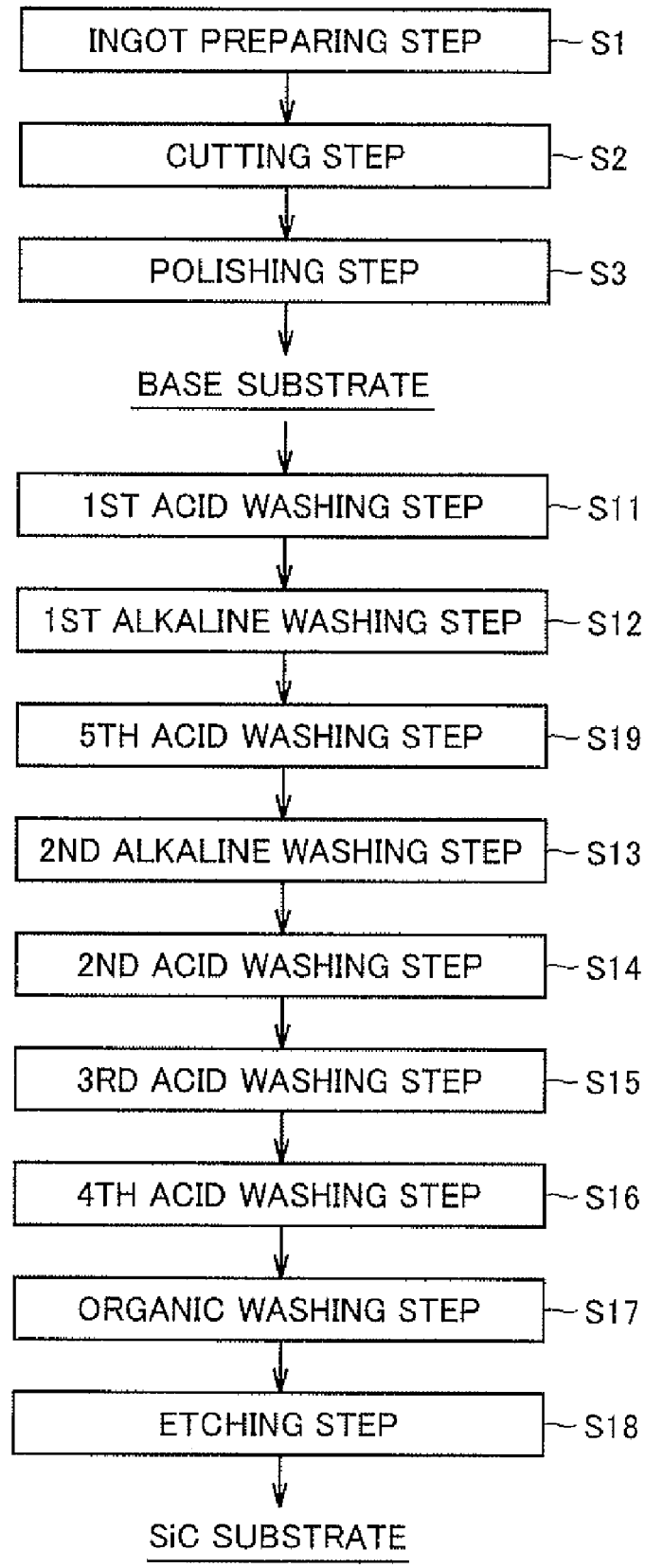

First, as shown in FIG. 7, the SiC substrate is manufactured according to the manufacturing method of the SiC substrate of the third embodiment. The SiC substrate is not particularly restricted provided that the step of performing the washing using the alkaline solution is executed twice or more, and may be manufactured by the manufacturing method of the SiC substrate of the first embodiment shown in FIG. 3 or that of the second embodiment shown in FIG. 4.

Then, as shown in FIGS. 6 and 7, epitaxial layer 21 is formed on main surface 11 of SiC substrate 10 (step S31: epitaxial layer forming step). The method of forming epitaxial layer 21 is not particularly restricted, and it may be formed, e.g., by a vapor growth method such as an HVPE method, MBE method, OMVPE method, sublimation method or CVD method, or a liquid growth method such as a flux method or a high nitrogen pressure solution method.

By executing the above steps S1-S3, S11-S22 and S31, epitaxial wafer 20 shown in FIG. 6 can be manufactured. Epitaxial wafer 20 uses SiC substrate 10 having the residues of 0.2 or more and smaller than 200 in number on main surface 11. When epitaxial layer 21 is manufactured by the vapor phase method or liquid phase method, a situation that these residues form nuclei of abnormal growth so that occurrence of defects can be suppressed. The vapor growth method can suppress such a situation that the residues impede the flow of the material gas and the carrier gas. This promotes the growth of epitaxial layer 21 in a downstream position in the flow direction of the material gas and the carrier gas. This can suppress occurrence of defects such as shallow pits due to the residues.

PRACTICAL EXAMPLES

In the following practical examples, effect was determined in connection with the structure that an average of the residues on the main surface of the SiC substrate are 0.2 or more and smaller than 200 in number.

Invention Example 1

A manufacturing method of an SiC substrate in an invention example 1 (i.e., an example 1 of the invention) is basically pursuant to the manufacturing method of the SiC substrate of the first embodiment.

More specifically, a base substrate having a main surface and made of SiC was manufactured (S1-S3). The base substrate had a size of 2 inches. The main surface of the base substrate was a (0001) plane.

Then, the first acid washing step (S11) was performed by washing the main surface of the base substrate with the first acid solution at 80° C. made of the sulfuric acid and hydrogen peroxide water mixed at the ratio, e.g., of 5:1.

Then, the first alkaline washing step (S12) was performed by washing the main surface of the base substrate with the first alkaline solution at 80° C. made of water, ammonia and hydrogen peroxide water mixed at the ratio of 5:1:1. Then, the main surface of the base substrate was washed using the pure water.

Then, the second alkaline washing step (S13) was performed by washing the main surface of the base substrate with the second alkaline solution that is the same as the first alkaline solution. Then, the main surface of the base substrate was washed using the pure water.

Then, the second acid washing step (S14) was performed by washing the main surface of the base substrate with the second acid solution at 80° C. made of a mixture of water, hydrochloric acid and hydrogen peroxide water mixed at the ratio of 6:1:1. Then, the main surface of the base substrate was washed using the pure water.

Then, the third acid washing step (S15) was performed by washing the main surface of the base substrate with the nitro-hydrochloric acid made of a mixture of nitric acid and hydrochloric acid mixed at the ratio of 3:1. Then, the main surface of the base substrate was washed using the pure water.

Then, the fourth acid washing step (S16) was performed by washing the main surface of the base substrate with fluoroacid or fluoro-nitric acid. Then, the main surface of the base substrate was washed using the pure water.

Then, the organic washing step (S17) was performed by washing the main surface of the base substrate with isopropyl alcohol. Then, the main surface of the base substrate was washed using the pure water.

Then, the etching step (S18) was performed by etching the main surface of the base substrate in the hydrogen gas.

The SiC substrate of the invention example 1 was manufactured by executing the aforementioned steps S1-S3 and S11-S18. Ten substrates were manufactured as the SiC substrates of the invention example 1.

Invention Example 2

A manufacturing method of an SiC substrate in an invention example 2 is basically pursuant to the manufacturing method of the SiC substrate of the third embodiment. Thus, the step of washing the base substrate with the alkaline solution was performed three times in the manufacturing method of the SiC substrate of the invention example 2.

Specifically, the third alkaline washing step (S21) was performed by washing the main surface of the base substrate with the potassium hydroxide solution of pH exceeding 13.

Then, the organic washing step (S22) was performed by washing the main surface of the base substrate using the isopropyl alcohol. Then, the main surface of the base substrate is washed using pure water.

Similarly to the invention example 1, steps S11-S18 were executed. By executing the above steps S1-S3, S11-S18, S21 and S22, the SiC substrate of the invention example 2 was manufactured. Ten substrates were manufactured as the SiC substrates of the invention example 2.

Invention Example 3

A manufacturing method of an SiC substrate of an invention example 3 basically includes substantially the same steps as the manufacturing method of the SiC substrate of the invention example 2, but is different therefrom in that it does not include the second alkaline washing step (S13). Thus, the manufacturing method of the SIC substrate of the invention example 3 executed the step of washing the base substrate with the alkaline solution twice. Ten substrates were manufactured as the SiC substrates of the invention example 3.

Comparison Example 1

Basically, a manufacturing method of an SiC substrate of a comparison example 1 includes substantially the same steps as the manufacturing method of the SiC substrate of the invention example 1, but is different therefrom in that it does not include the second alkaline washing step (S13). Thus, the manufacturing method of the SiC substrate of the comparison example 1 executes the step of washing the base substrate with the alkaline solution once. Ten substrates were manufactured as the SiC substrates of the comparison example 1.

(Measuring Method)

In connection with the invention examples 1-3 and the comparison example 1, residues on the main surface were measured after the washing using the alkaline solution. Results are described in the following table 1. The measurement of the residues was performed by obtaining an average of values determined from five-point measurement, which is performed with the AFM within a visual field with sides of 50 μm on the main surface of the SiC substrate. The five points were the following regions shown in FIG. 1(B). One point is within a range with the sides of 1 cm from the center of the main surface. Two points were ranges with sides of ½ cm having centers spaced in the <11-20> direction from each other with the center therebetween, respectively, and each spaced by 70% of a radius from the center. Further, other two points were ranges with sides of ½ cm having centers spaced in the <1-100> direction from each other with the center therebetween, respectively, and each spaced by 70% of the radius from the center. The measured residues had diameters between 0.01 nm and 10 μm.

Figure 9:
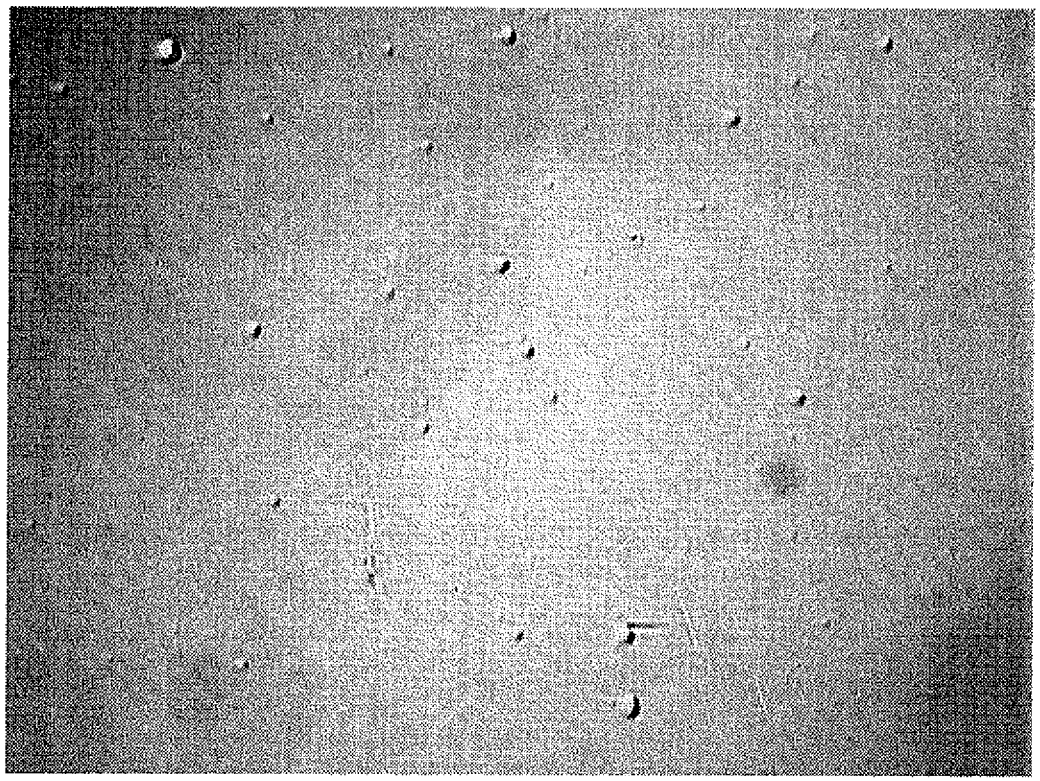
FIG. 9 shows shallow pits that occur on an epitaxial layer that are formed using the SiC substrate in the comparison example 1 and are observed through the AFM.

By the CVD method, the SiC layer was formed as the epitaxial layer on the main surface of the SiC substrate after the etching step (S18). The number of shallow pits on the main surface of this epitaxial layer was measured with the AFM. The measurement of the shallow pits was performed by obtaining the average of values determined from the five-point measurement, which is performed with the AFM within a visual field with sides of 50 μm. The five measurement points ware substantially the same as the measurement positions for the residues. In this case, the shallow pits were observed, e.g., as shown in FIG. 9. Results of the shallow pit numbers are described in the following table 1. In the table, "0" represents that no shallow pit occurred.

TABLE 1

| | Invention Example 1 | Invention Example 2 | Invention Example 3 | Comparison Example 1 |
|---|---|---|---|---|
| Before 3rd alkaline washing step (S21) | — | 1000000 | 1000000 | — |
| After 3rd alkaline washing step (S21) | — | 1000 | 1000 | — |
| Before 1st alkaline washing step (S12) | 1000000 | 1000 | 1000 | 1000000 |
| After 1st alkaline washing step (S12) | 200-300 | 10-199 | 10-199 | 200-300 |
| After 2nd alkaline washing step (S13) | 60-150 | 5-50 | — | — |
| After etching step (S13) | 5 or less | 0.2 | 0.4 | 50 |
| Shallow pits | 0.5 | 0 | 0 | 5 |

(Result of Measurement)

As shown in the table 1, the average of residues on the main surface was between 5 and 199 before the etching step (S18) according to the invention examples 1 to 3 in which the washing using the alkaline solution was performed twice or more. According to the comparison example 1 that performs the washing using the alkaline solution only once, the average of residues on the main surface was between 200 and 300 before the etching step (S18).

The average of residues on the main surface was between 0.2 and 5 after the etching step (S18) according to the invention examples 1 to 3 in which the washing using the alkaline solution were performed twice or more. According to the comparison example 1 that performs the washing using the alkaline solution only once, the average of residues on the main surface was 50 after the etching step (S18).

Accordingly, no shallow pit or a shallow pit of 0.5 or less in number occurred in the epitaxial layer formed on the SiC substrate according to the invention examples 1 to 3. However, five shallow pits occurred in the epitaxial layer formed on the SiC substrate of the comparison example 1.

It has been understood from the above that the washing performed twice or more with the alkaline solution can reduce the average of residues on the main surface to a range equal to or larger than 0.2 and smaller than 200, and further execution of the etching can reduce it to a range between 0.2 and 50. It has been understood that the average of residues in the above range can suppress formation of defects due to the residues when the epitaxial layer is formed on the main surface. The inventors have found that the reason of such suppressing is as follows.

Figure 10:
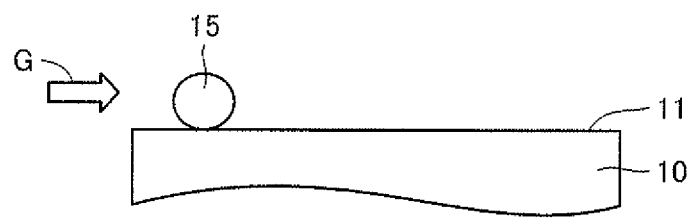
FIG. 10 is a cross section schematically showing a main surface of the SiC substrate having residues.
Figure 11:
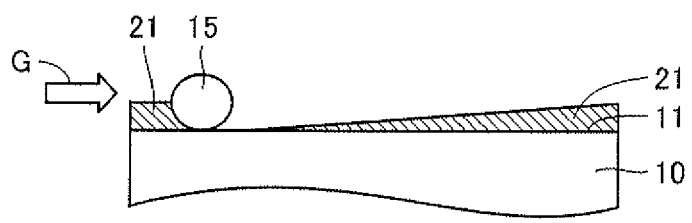
FIG. 11 is a cross section schematically showing a state in which the epitaxial layer is formed on the SiC substrate having the residues.

As shown in FIG. 10, if residues 15 are present on main surface 11 of SiC substrate 10, residues 15 will impede the flow of gases G such as material and carrier gases when epitaxial layer 21 is formed on main surface 11 by the vapor growth method. This delays the epitaxial growth on main surface 11 in a position downstream from residue 15 in the flow direction of gas G. Therefore, defects due to the residues on main surface 11 of SiC substrate 10 occur.

It has been understood from the above that the formation of the defects in the epitaxial layer due to the residues can be suppressed when the average of residues on the main surface is 0.2 or more and smaller than 200 before the etching step (S18), and the average of residues on the main surface is between 0.2 and 5 after the etching step (S18). Therefore, it has been understood that the structure can suppress the influence on the operation of the manufactured semiconductor device that is provided with electrodes formed in this epitaxial layer. Thus, it has been understood that the defects caused in the epitaxial layer can be stably reduced by keeping the average of residues on the main surface of the SiC substrate to fall within the above range before forming the epitaxial layer.

Particularly, according to the invention examples 2 and 3 in which the third alkaline washing step (S21) using the third alkaline solution containing the potassium hydroxide was performed prior to the first alkaline washing step (S12), it was possible to reduce the residues remaining after the second alkaline washing step (S13) and to reduce remarkably the average of residues remaining after the etching step (S18). Therefore, no shallow pit occurred in the epitaxial layer formed on the SiC substrate. Therefore, it has been be understood that the average of residues can be remarkably reduced by executing the third alkaline washing step (S21).

Although the present invention has been described and illustrated in detail, it is clearly understood that the same is by way of illustration and example only and is not to be taken by way of limitation, the scope of the present invention being interpreted by the terms of the appended claims.

What is claimed is:

1. A silicon carbide substrate comprising a main surface, and residues on said main surface, wherein
   said main surface is washed using a first alkaline solution; and
   said main surface is washed using a second alkaline solution after washing said main surface using said first alkaline solution,
   an average of said residues on said main surface washed using said second alkaline solution are equal to or larger than 0.2 and smaller than 200 in number.

2. The silicon carbide substrate according to claim 1, wherein
   the average of the residues on said main surface is between 0.2 and 50.

3. The silicon carbide substrate according to claim 1, wherein
   said residue is made of at least one type of substance selected from a group consisting of colloidal silica, chrome oxide, diamond, adhesive and wax.

4. The silicon carbide substrate according to claim 3, wherein
   said adhesive or wax is made of at least one type of substance selected from a group consisting of hot melt, acrylic and epoxy.

5. The silicon carbide substrate according to claim 1, wherein
   said residue has a diameter between 0.01 nm and 10 μm.

6. A silicon carbide substrate comprising a main surface, and residues on said main surface, wherein
   said main surface is washed using a first alkaline solution;
   said main surface is washed using a second alkaline solution after washing said main surface using said first alkaline solution; and
   said main surface is etched after washing said main surface using said second alkaline solution,
   an average of said residues on said main surface being etched are between 0.2 and 5 in number.

7. The silicon carbide substrate according to claim 6, wherein
   the average of the residues on said main surface is between 0.2 and 0.4.

8. The silicon carbide substrate according to claim 6, wherein
   said residue is made of at least one type of substance selected from a group consisting of colloidal silica, chrome oxide, diamond, adhesive and wax.

9. The silicon carbide substrate according to claim 8, wherein
   said adhesive or wax is made of at least one type of substance selected from a group consisting of hot melt, acrylic and epoxy.

10. The silicon carbide substrate according to claim 6, wherein
    said residue has a diameter between 0.01 nm and 10 μm.

11. An epitaxial wafer comprising:
    the silicon carbide substrate according to claim 1; and
    an epitaxial layer formed on said main surface of said silicon carbide substrate.

* * * * *